United States Patent [19]

Cota

[11] Patent Number: 4,993,559
[45] Date of Patent: Feb. 19, 1991

[54] WAFER CARRIER

[75] Inventor: Marlo E. Cota, Scottsdale, Ariz.

[73] Assignee: Motorola, Inc., Schaumburg, Ill.

[21] Appl. No.: 386,665

[22] Filed: Jul. 31, 1989

[51] Int. Cl.$^5$ ............................................. A47G 19/08
[52] U.S. Cl. ...................................... 211/41; 432/253
[58] Field of Search ........................... 211/41, 40, 181; 432/253

[56] References Cited

U.S. PATENT DOCUMENTS 4,318,749  3/1982  Mayer ............................... 211/41 X
4,653,636  3/1987  Armstrong ........................ 211/41 X Primary Examiner—Blair M. Johnson
Attorney, Agent, or Firm—Robert M. Handy

[57] ABSTRACT

An improved carrier for holding semiconductor wafers at a predetermined angle during processing is described having side rails with slots for holding lateral edges of the wafer and bottom slots having a curved floor for supporting the wafer edge without substantially contacting the corners of the wafer where the wafer edge and principal wafer surfaces join. This reduces yield loss due to wafer edge chipping. The side slots are desirably off-set from corresponding bottom slots so that the wafers will be consistently oriented at the predetermined angle and have uniform spacing.

17 Claims, 3 Drawing Sheets

WAFER CARRIER

FIELD OF THE INVENTION

This invention concerns wafer carriers and, more particularly, wafer carriers for use during processing of electronic wafers, as for example, semiconductor wafers.

BACKGROUND OF THE INVENTION

Wafer carriers have been used for many years in the electronic arts, particularly the semiconductor arts, to support wafers during processing. Typical wafer carriers are described, for example, in U.S. Pat. Nos. 4,355,974, 4,256,229, 4,515,104, 3,678,893, 3,534,862, 4,023,691, and 3,610,613 which are incorporated herein by reference. Quartz is a common construction material for wafer carriers that are intended for high temperature processes. Other materials are also used.

A problem with processing electronic wafers is that defects or non-uniformities are introduced into the wafers during loading, unloading and processing in the carriers. For example, edge chipping may occur, or wafers may become stuck in the carriers, or dislocations may be created in the wafers due to carrier induced stresses, or process gas flow may be perturbed so as to introduce non-uniformities in properties across a wafer or from wafer to wafer. Often, these defects are so small as to escape immediate detection or of a nature to be invisible to the unaided eye, and only reveal themselves in the form of defective devices or circuits or unexpected wafer fracture or "out-of-spec" properties or the like, so that overall manufacturing yield is reduced. As wafers become larger and more expensive, these problems have greater impact on the manufacturing process.

Previous attempts to reduce wafer defect formation and non-uniformities have involved placing the wafers in carriers where they are supported so as to have a slight angle to the vertical. Such expedient is described in U.S. Pat. Nos. 4,355,974 and 4,256,229. While this arrangement may insure uniform wafer spacing it does little to assist in reducing edge chipping which, among other things, is caused by contact between the wafer carrier and the wafer corners where the flat faces of the wafers and the wafer edges join. It has been typical to use V-shaped, or concave-shaped or flat-bottomed slots for supporting the wafer edges. These prior art arrangements substantially increase the chances of edge chipping at the wafer corners. Thus, a need continues to exist for improved wafer carriers that reduce or eliminate edge chipping and that avoid other non-uniformity and/or defect problems often encountered with electronic wafers, especially semiconductor wafers.

BRIEF SUMMARY OF THE INVENTION

Accordingly, it is an object of the present invention to provide an improved wafer carrier and wafer handling method. It is a further objective to provide an improved carrier and method that reduces contact between the wafer corners and the wafer carrier. It is a still further objective to provide the foregoing improvements in combination with uniform wafer spacing at a predetermined angle in the carrier.

The foregoing and other objects and advantages are provided by a wafer carrier having a plurality of slots for receiving and supporting a plurality of wafers at a predetermined angle, comprising, side slots having walls for engaging portions of the wafer faces near lateral edges of the wafers, and bottom slots having bottoms that are convex upward for supporting bottom edges of the wafers.

In a first embodiment, individual side slots have facing parallel walls. In another embodiment, individual side slots have facing non-parallel walls comprising a first wall inclined at a first angle and a second, facing, wall inclined at an equal but opposite angle. In a further embodiment the interior walls of the side slots facing the wafer edge are desirably convex toward the wafer edge.

The bottom slots have first wall portions at the first angle and second wall portions at the second angle. It is desirable that individual bottom slots have a wall spacing that varies with depth into the slot, being greater near the upper portion of the slot, less at an intermediate depth and greater again near the lower portion of the slot.

Stated alternatively, the wafer carrier comprises side slots having walls oriented at a predetermined angle for engaging portions of the wafer faces near lateral edges of the wafers and bottom slots for upholding bottom edges of the wafers without contacting corners of the wafers where major faces and edges of the wafers intersect. The bottom slots are desirably wider in the vicinity of the location of the corners of the wafers.

There is further provided a method for processing a plurality of wafers comprising, providing a wafer carrier having a plurality of slots for receiving and supporting the plurality of wafers at a predetermined angle, wherein the wafer carrier comprises side slots with walls for engaging portions of the wafer faces near lateral edges of the wafers and bottom slots for upholding bottom edges of the wafers without contacting corners of the wafers where major faces and edges of the wafers intersect, and loading the plurality of wafers into the plurality of slots so that all wafers are oriented at substantially the predetermined angle without bottom corner contact. It is desirable but not essential that individual side slots have parallel walls at the predetermined angle or that individual side slots having walls corresponding to positive and negative values of the predetermined angle. It is further desirable but not essential that the interior walls of the side slots are convex toward the wafer edge.

Stated alternatively, there is provided a method for processing a plurality of wafers comprising, providing a wafer carrier having a plurality of slots for receiving and supporting the plurality of wafers at a predetermined angle, wherein the wafer carrier comprises side slots with walls for engaging portions of faces of the wafers near side edges of the wafers and bottom slots with convex upward floors for supporting bottom edges of the wafers, and loading the plurality of wafers into the plurality of slots so that all wafers are oriented at substantially the predetermined angle and are edge supported on the convexly curved floors of the bottom slots.

These and other objects and advantages of the present invention will be more fully understood by considering the accompanying figures and the explanation that follows.

DETAILED DESCRIPTION OF THE FIGURES

For convenience of explanation, the figures show and the accompanying text describes a wafer carrier constructed of quartz. Such wafer carriers are extensively used in processing of electronic wafers, particularly semiconductor wafers. While quartz is a common construction material for wafer carriers intended to be subjected to high temperature processing, the present invention is not limited to wafer carriers constructed of quartz but applies to wafer carriers constructed of any material.

In the electronics art, wafer carriers are commonly referred to a "boats", and as used herein, the words wafer "carrier" and "boat", whether singular or plural, are used interchangeably to refer to an apparatus for supporting a multiplicity of electronic wafers generally in a non-flat orientation.

Figure 1:
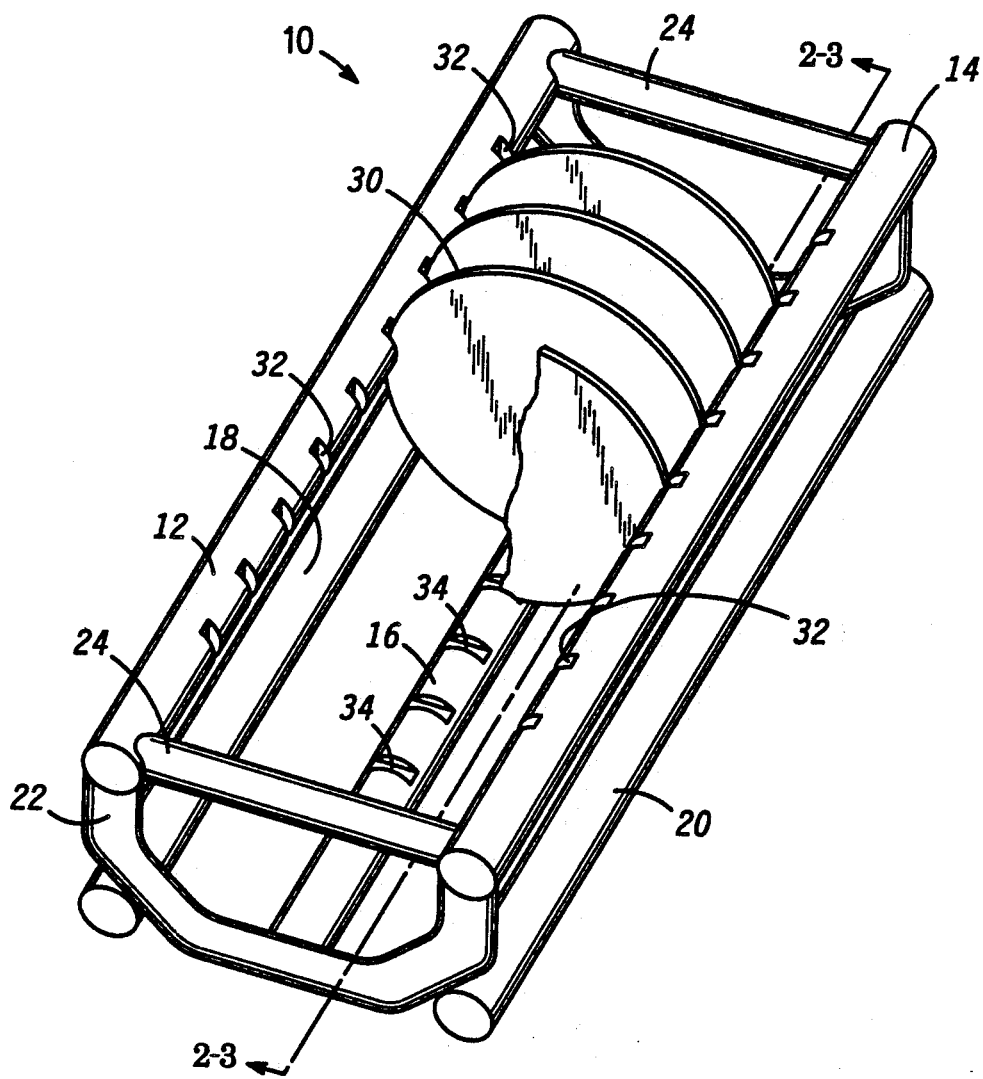
FIG. 1 shows a perspective view of a typical wafer boat according to the prior art.

FIG. 1 shows a perspective view of a typical wafer boat according to the prior art, in which the wafers are approximately upright. Wafers are typically oriented from 0–45 degrees with respect to the vertical. Boat 10 comprises side rails 12, 14 and bottom rail 16 which act cooperatively to support wafers 30 in various slots provided in rails 12, 14, 16. Additional rails 18, 20, 22, 24 are conveniently provided for holding slotted rails 12, 14, 16 in appropriate positions. Slots 32 are provided in side rails 12, 14 and slots 34 are provided in bottom rail 16. Slots 32, 34, are of sufficient width to accommodate the thickness of wafers 30 with some additional space left over to prevent binding. For example, boats designed to accommodate 100 mm diameter, 0.6 mm thick silicon semiconductor wafers will typically have slot widths in the range of 0.8 mm to 1.2 mm with about 1.0 mm being typical. Such slots (and wafers) may be spaced about 2–20 mm apart, depending on the process requirements. Means and methods for constructing such wafer boats ar well known in the art.

Figure 2:
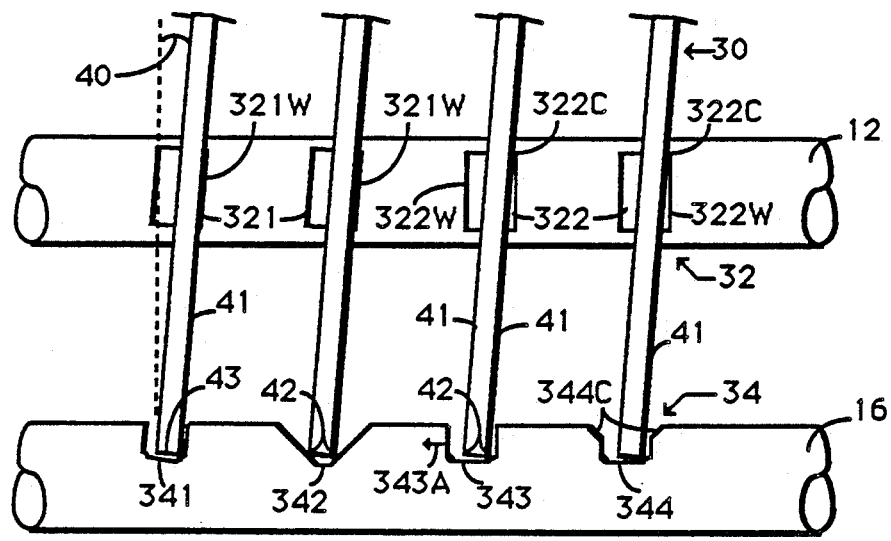
FIG. 2 shows a partial side view of a portion of a wafer boat illustrating a side rail and bottom rail and various slot therein for holding wafers, according to the prior art.

FIG. 2 shows a partial side view of a portion of wafer boat 10, comprising side rail 12 and bottom rail 16, and illustrating various prior art configurations of side rails slots 32 and bottom rails slots 34. For convenience of illustration, wafers 30 are shown as all being inclined at the same angle although this is not essential. While FIG. 2 illustrates various different slot configurations as being present in the same boat, those of skill in the art will understand that this is merely for purposes of illustration and that boats are ordinarily constructed using only one of these variations.

Side rail 12 is shown with side slots 32 according two different configurations identified by the numbers 321, 322. Walls 321W of side slots 321 are tilted at the same angle 40 with respect to the vertical as the intended wafer lean angle. Hence, principal faces wafers 30 lean against walls 321W of side slots 321. Side slots 322 are oriented with their walls 322W substantially vertical so that principal faces of wafers 30 contact slots 322 substantially at corners 322C.

Four different configurations of bottom slots 34 in bottom rail 16 are shown in FIG. 2. This is merely for purpose of illustration. Bottom slot 341 has its walls tilted at the same angle 40 as the intended wafer lean angle. Bottom slot 342 is a trough or wedge shaped slot. Slot 343 has its walls approximately vertical, similar to slot 322 in side rail 12, but is displaced laterally in the direction of arrow 343A with respect to the corresponding slot 322 so as to cause wafer 30 to lean at a slight angle. Slot 344 is similar to slot 343 except that corners 344C have been slightly relieved to make it easier to insert wafer 30 into slot 344. Those of skill in the art will understand that in the prior art, various combinations of side rail slots and bottom rail slots are used.

Electronic wafers 30 are, typically, of brittle materials, such as for example, semiconductor materials, or quartz, or sapphire, or the like. Such wafers are particularly susceptible to chipping. Chipping usually occurs at the corners of the wafers, that is, corners 42 where broad faces 41 and edge 43 of wafer 30 meet.

A common difficulty with the prior art slot arrangements of FIG. 2 is that corners 42 of wafers 30 contact some portion of bottom slots 34. Thus, there is a significant probability that as wafers 30 are placed into slots 34 in wafer boat 10, that corners 42 will be chipped as a result of their contact with various portions of slots 34 in bottom rail 16.

A further difficulty with the prior art arrangement of FIG. 2, is that wafers 30 are constrained to be upright or lean in only one direction, e.g., toward the right end of the boat illustrated in FIGS. 1–2, (depending on the slot arrangement). While this is helpful in the sense that it tends to promote a uniform wafer-to-wafer spacing, it is disadvantageous in that it means that such boats have only one usable orientation. For example, if part of a boat is used as a reference surface in connection with an automatic wafer handler or has the receptacle for the boat lifting handle, then the wafers in that boat can only lean in a particular direction with respect to that reference surface or receptacle. If wafer processing requires that the wafers lean in different directions during different operations, a different set of boats must be used for those different operations., e.g., a right leaning boat where a right leaning orientation is desired and a left leaning boat were a left leaning orientation is desired. This adds to the cost of manufacture.

Figure 3:
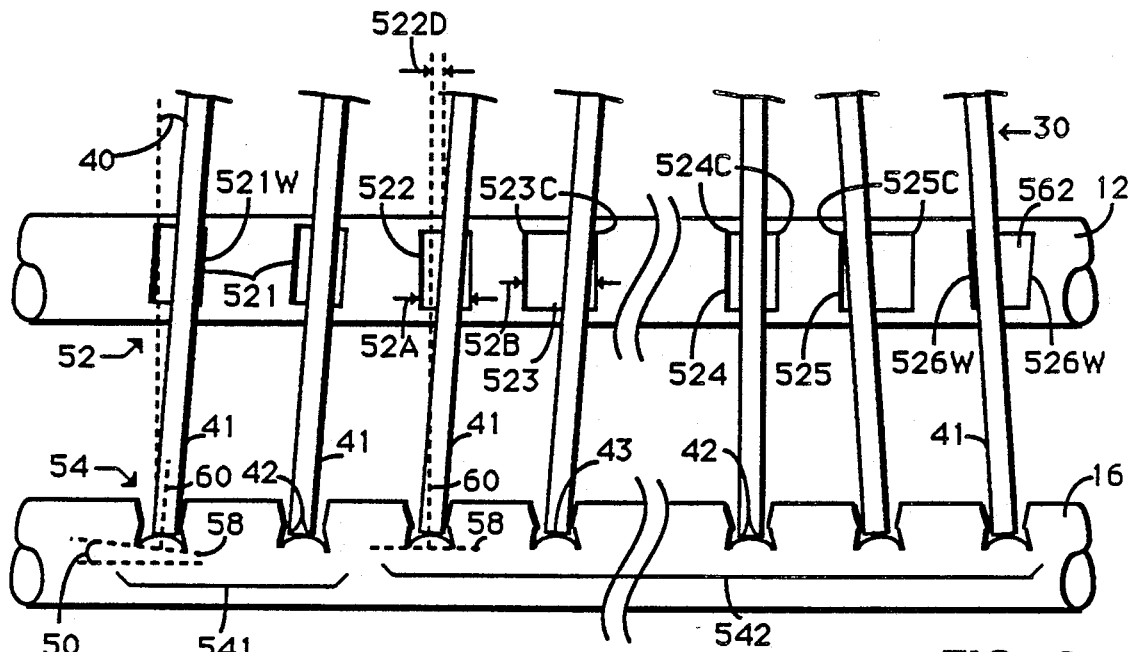
FIG. 3 shows a side view of a portion of a wafer boat similar to FIG. 2 according to the several variations of the present invention.

These and other problems are overcome by the arrangement of the present invention illustrated for a variety of alternative configurations in FIG. 3. Side rails 12 and bottom rail 16 perform the same function in FIG. 3 as in FIG. 2, and wafers 30 are oriented at a predetermined angle 40 with respect of the vertical. Angle 40 may be anywhere from 0 to approximately 45 degrees. Side rail slots 521 are similar to side rail slots 321 in that walls 521W are oriented at substantially the same angle 40 as the wafer lean angle so that sidewalls 521W provide substantially uniform contact to a portion of broad face 41 of wafers 30. Side rail slot 522 is similar to prior art slot 322 in that its walls are oriented vertically with respect to rail 12, and its centerline is displaced by small amount 522D from the centerline of the corresponding slot in bottom rail 16. Slots 521, 522 have width 52A which is substantially similar to width 32A of prior art slots 32. Wafer 30 rests substantially against corner 522C in side rail slot 522. Side rail slot 524 is similar in configuration to side rail slot 522 except the corresponding slot in bottom rail 16 is not displaced by amount 522D. Accordingly, wafer 30 may rest against either corner 524C in side rail slot 524.

Side rail slots 523, 525 and 526 have widths 52B which are greater than width 32A of prior art slots 322 and have centerlines which are oriented substantially vertically above the centerlines of the corresponding slots in bottom rail 16. Thus wafers 30 in slots 523, 525 and 526 may lean against either of corners 523C, 525C, or in the case of side slot 526 against either of slanted sidewalls 526W. Thus the arrangement of side slots 523, 525 and 526 allows boats to be either left-leaning or right-leaning, according to the desire of the operator at the time of loading or insertion into the processing equipment. Merely by momentarily moving or tilting the boat wafers 30 come to rest against one or the other of the corners or one or the other of the slot walls depending on the direction of motion or tilt.

Slot 526 has angled walls like slots 521 but has a trapezoidal shape so as to provide the above described operator selectable left or right leaning wafer orientation capability. Thus, the side rail slot arrangement illustrated by slots 523, 525 and 526 overcome the problem with prior art boats intended for use in either left-leaning or right-leaning applications and this eliminates the need for duplicate boats. This is particularly valuable in connection with automatic wafer handlers where alignment of the handler to a single reference surface on the boat is critical.

Slots 54 in bottom rail 16 of FIG. 3 are of two types designated by the numbers 541 and 542. Bottom rail slots 541 and 542 differ by the orientation of their central axes 60. Bottom rail slots 541 have their central axes 60 and baselines 58 (shown by the dashed lines) inclined at angle 50. Angle 50 is conveniently approximately equal to angle 40. Bottom rail slots 542 have their central axes 60 and base planes 58 (indicated by the dashed lines) respectively vertical and horizontal. Either configuration may be used.

Figure 4:
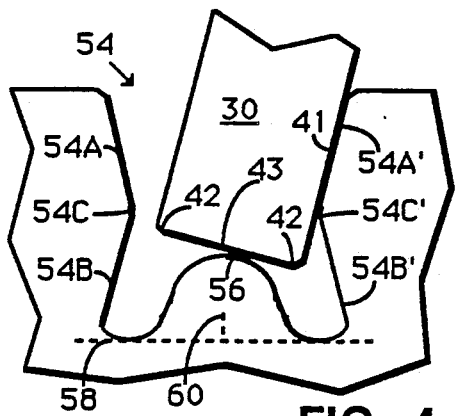
FIGS. 4–5 show enlarged portions of FIG. 3 illustrating the bottom rail slot and wafer arrangement in more detail according to several variations of the present invention.
Figure 5:
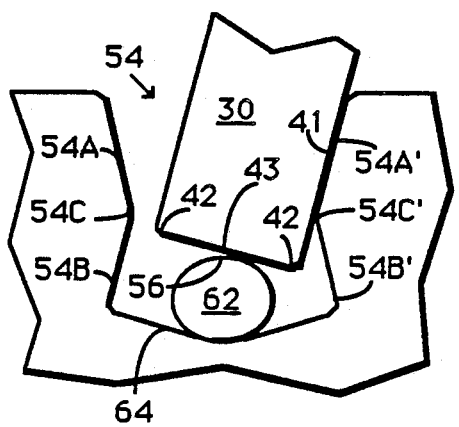

Further details concerning the construction of slots 54 in bottom rail 16 are illustrated in FIGS. 4-5 which are much enlarged side views of a single bottom rail slot and corresponding portion of wafer 30. Referring now to FIG. 4, bottom rail slot 54 has walls 54A-B and 54A'-B' that join 54C, 54C'. Walls 54A, 54A' initially angle inwards so that the slot width decreases and then wall portions 54B, 54B' angle outwards so that the slot width increases. This insures that one or the other of bulges 54C, 54C' will contact one or the other of faces 41.

In addition, bottom portion 56 of slot 54 is convex upward. This insures that the supportive contact between bottom rails 16 and wafer 30 occurs on edge 43 of wafer 30 rather than at corners 42. This materially decreased the probability that wafer 30 will become chipped when it is inserted or removed from the wafer carrier or during handing thereof. This feature is not present in any of the prior art slot arrangements. While FIG. 4 illustrates the arrangement for a type 542 slot (e.g. baseline 58 horizontal, central axis 60 vertical), those of skill in the art will appreciate that the same arrangement is used for a type 541 slot but with baseline 58 and centerline 60 inclined, e.g., at the desired wafer lean angle. Either arrangement reduces the probability of edge chipping.

The bottom slot configuration illustrated in FIGS. 3-5 may be fabricated in a number of different ways. For example, slots 54 may be ground into bottom rails 16 using a carbide or diamond wheel having an appropriate shape. For example, the edge of the grinding wheel may be shaped to provide half of the convex curve of bottom surface 56 shown in FIG. 4. A first plunge cut is made at a first angle so that one side of the wheel grinds surface 54A' and the other side of the wheel grinds surface 54B and the edge grinds one half of convex surface 56. A second plunge cut is then made at the complementary angle with the wheel reversed, so as to grind surface 54B' and surface 54A while the edge grinds the other half of convex surface 56. Alternatively, a grinding spindle having an end resembling a "dove-tail" cutter may be used to produce a cross-cut slot which is wider at the bottom.

FIG. 5 shows an alternative structure and method in which a substantially flat edged wheel or "dove-tail" or cutter is used and curve 56 provided by fusing a small piece, for example, of quartz rod 62 to bottom surface 64 of bottom slot 54. Rod 62 may have a circular, elliptical or polygonal cross-section. The arrangement of either FIGS. 4 or 5 produces satisfactory results.

Figure 6:
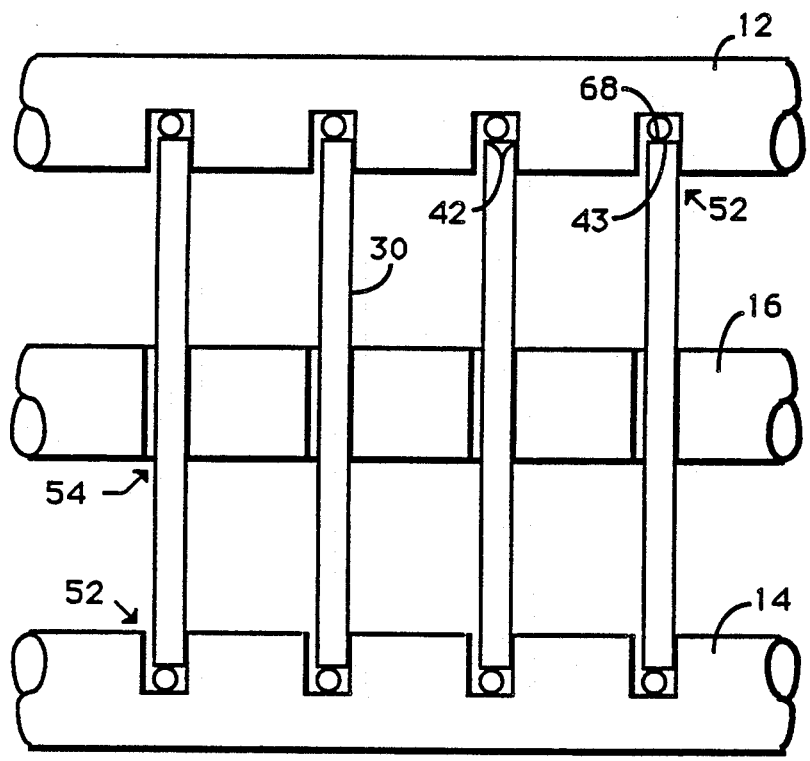
FIG. 6 shows a top view of a portion of a wafer boat illustrating a side rail and slots thereon for holding wafers, according to a further embodiment of the present invention.

The arrangement shown in FIGS 4-5 with curved slot bottom surface 56 is also useful in side slots 52 to prevent wafer corner contact therein. The walls of the side slots which face the major surfaces of the wafers need not be angled as in FIGS. 4-5. FIG. 6 shows a top view of a portion of wafer boat 10 illustrating side rail 12 with straight slots 52 therein for holding wafers 30 according to this embodiment. When viewed looking down on boat 10, surface 68 in side slot 52 which faces wafer edge 43 is convexly curved toward wafer 30 in much the same fashion as previously described for convexly curved surface 56 in bottom slot 54. This prevents wafer corner 42 from contacting the interior part of the slot and further reduces chipping. Any convexly curved or polygonal shape may be used for surface 68 facing wafer edge 43 and it may be formed as an integral part of side rail 12, 14, as for example like convexly curved surface 56 in FIG. 4, or by attachment of a convexly curved piece to an otherwise flat or concave interior wall of the slot, as for example like rod 62 in FIG. 5. FIG. 6 illustrates the embodiment wherein convexly curved surface 68 of slot 52 facing wafer edge 43 is provided by attachment of a round piece to an otherwise flat interior wall of slot 52, in much the same manner in which convexly curved surface 56 is provided in slot 54 of FIG. 5 by attachment of rod 62 to interior wall 64.

Having described the structure of the improved wafer carrier of the present invention, an improved method of handling and processing wafers is provided by the steps of (1) providing a wafer carrier corresponding to the above-description and, (2) loading wafers into the above described carrier with the bottom edges of the wafers supported on the convexly curved floor of the bottom rail slots. This avoids bottom corner contact. Where the side slots also have convex interior walls facing the wafer edge, this avoids side corner contact to the wafer. Where the embodiment permitting alternative wafer lean angles is employed, a further step (3) of momentarily tilting or slightly displacing the carrier is followed in order to orient the wafers in one of the alternative lean positions. Improved processing results are obtained thereby and manufacturing yield is improved.

Having thus described the invention it will be apparent to those of skill in the art that various modifications may be made without departing from the scope thereof. For example, while angled walls in bottom slots 54 are desirable where angle 40 is non-zero, this is not essential. Further, angled walls are not necessary where angle 40 is zero, i.e. for substantially vertical wafers. Where angle 40 is non-zero, the angles of walls 54A, 54A' and 54B, 54B' desirably are of about the same magnitude as the intended wafer lean angle, but larger or smaller angles can also be used. In general, these angles should be at least as large as the intended wafer lean angle. Wafer lean angles of 0-45 degrees are useful, with 0-10 degrees being convenient, 0-4 degrees being preferred, and about 2 degrees being typical.

It will be apparent from the foregoing description that the present invention provides an improved wafer carrier and method therefore that reduces the contact between the wafers corners and wafer carrier. It will be further apparent based on the foregoing description that the improved carrier and method provided a uniform wafer for spacing at a predetermined, operator selectable, alternative angle irrespective of which end of the wafer carrier is being used as the reference plane.

Further, while the invention has been described for the example of a quartz wafer carrier, those of skill in the art will appreciate based on the description herein that the present invention applies to wafer carriers of any material, including but not limited to, carriers fabricated of metal or plastic or silicon carbide or semiconductor materials or combinations thereof. Therefore, it is desired to include these and other variations as will be apparent to those of skill in the art based on the foregoing description in the claims that follow.

What is claimed is:

1. A wafer carrier having a plurality of slots for receiving and supporting a plurality of wafers at a predetermined angle with respect to the vertical, comprising:
    side slots for engaging portions of principal faces of the wafers near lateral edges of the wafers; and
    bottom slots for supporting bottom edges of the wafers, wherein bottoms of the bottom slots are convex upward when viewed in a direction parallel to a principal face of a wafer and tangential to the edge of the wafer where it resides in a slot.

2. The wafer carrier of claim 1 wherein individual bottom slots have outward leaning opposed sidewalls near an upper portion of the slot, and inward leaning opposed sidewalls near a lower portion of the slot.

3. The wafer carrier of claim 2 wherein the outward leaning and inward leaning opposed sidewalls of the individual bottom slots approach a minimum separation located between the upper and lower portions of the slot.

4. The wafer carrier of claim 1 wherein an interior wall of individual side slots facing the wafer edge is convex toward the wafer edge.

5. The wafer carrier of claim 1 wherein individual bottom slots have sidewall slopes that vary with depth into the slot, having one value near an upper portion of the slot and a substantially equal but opposite value near a lower portion of the slot.

6. The wafer carrier of claim 1 wherein individual bottom slots have a sidewall spacing that varies with depth into the slot, being greater near an upper portion of the slot, less at an intermediate depth and greater again near a lower portion of the slot.

7. A wafer carrier having a plurality of slots for receiving and supporting a plurality of wafers at a predetermined angle, comprising:
    side slots for engaging portions of principal faces of the wafers near lateral edges of the wafers; and
    bottom slots having curved floors for upholding bottom edges of the wafers without either bottom corners of the wafers where the principal faces and edges of the wafers join, resting on the bottom slots.

8. A wafer carrier having a plurality of slots for receiving and supporting a plurality of wafers at a predetermined angle, comprising, side slots for engaging portions of principal faces of the wafers near lateral edges of the wafers, and bottom slots having curved floors for upholding bottom edges of the wafers without substantially contacting corners of the wafers where the principal faces and edges of the wafers join, wherein a surface in the side slots facing the wafer edge is convex toward the wafer edge.

9. A wafer carrier having a plurality of slots for receiving and supporting a plurality of wafers at a predetermined angle, comprising, side slots for engaging portions of principal faces of the wafers near lateral edges of the wafers, and bottom slots having curved floors for upholding bottom edges of the wafers without substantially contacting corners of the wafers where the principal faces and edges of the wafers join, wherein individual side slots have parallel walls oriented at the predetermined angle between zero and forty-five degrees from the vertical.

10. A wafer carrier having a plurality of slots for receiving and supporting a plurality of wafers at a predetermined angle, wherein each wafer has opposed first and second principal faces joined by an edge connected to the first and second principle faces by first and second rounded corners, respectively, comprising:
    opposed side slots for engaging portions of the first or second principal faces of the wafers near spaced apart lateral portions of the edges of the wafers; and
    bottom slots for upholding bottom edges of the wafers, by exerting an upward force thereon, without exerting an upward force on corners of the wafers where major faces and edges of the wafers join.

11. The wafer carrier of claim 10 wherein the bottom slots are wider in the vicinity of the location of the corners of the wafers than above the location of the corners of the wafers.

12. The wafer carrier of claim 10 wherein the side slots hold the wafer by contacting an edge but not either corner of the wafer.

13. A method for processing a plurality of wafers comprising:
    providing a wafer carrier having a plurality of slots for receiving and supporting the plurality of wafers wherein the wafer carrier comprises side slots for engaging portions of principal faces of the wafers near lateral edges of the wafers and bottom slots for upholding bottom edges of the wafers without substantially contacting corners of the wafers where the principal faces and edges of the wafers intersect, wherein bottoms of the bottom slots are convex upward when viewed in a direction parallel to a principal face of an individual wafer and tangential to the edge of the wafer where it contacts a slot; and loading the plurality of wafers into the plurality of slots so that all wafers are oriented at substantially a predetermined lean angle without substantial bottom corner contact.

14. The method of claim 13 wherein the step of providing the wafer carrier comprises providing an interior wall of side slots facing the wafer edge which is convex toward the wafer edge.

15. The method of claim 13 wherein the step of providing the wafer carrier comprises providing individual bottom slots having a sidewall spacing that varies with depth into the slot, being greater near an upper portion of the slot, less at an intermediate depth and greater again near a lower portion of the slot.

16. A method for processing a plurality of wafers comprising:

providing a wafer carrier having a plurality of slots for receiving and supporting the plurality of wafers at a predetermined angle, wherein the wafer carrier comprises side slots for engaging portions of principal faces of the wafers near lateral edges of the wafers and bottom slots with convex upward floors for supporting bottom edges of the wafers without providing an upward-directed force on corners of the wafers where the principal faces and edges join; and loading the plurality of wafers into the plurality of slots so that all wafers are edge supported on the convexly curved floors of the bottom slots.

17. The method of claim 16 wherein the providing step comprises providing side slots with a convexly curved surface facing the wafer edge.

* * * * *